(12) United States Patent
Han et al.

(10) Patent No.: US 7,846,292 B2
(45) Date of Patent: Dec. 7, 2010

(54) GAS INJECTOR AND APPARATUS INCLUDING THE SAME

(75) Inventors: Geun-Jo Han, Gyunggi-do (KR); Jeong-Beom Lee, Gyunggi-do (KR); Bu-Jin Ko, Daejeon (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 261 days.

(21) Appl. No.: 11/395,643

(22) Filed: Mar. 31, 2006

(65) Prior Publication Data
US 2006/0219362 A1 Oct. 5, 2006

(30) Foreign Application Priority Data
Apr. 1, 2005 (KR) .................. 10-2005-0027474

(51) Int. Cl.
*H01L 21/326* (2006.01)
*C23C 16/505* (2006.01)
(52) U.S. Cl. ................. 156/345.33; 118/715
(58) Field of Classification Search .......... 118/715; 156/345.33
See application file for complete search history.

(56) References Cited

U.S. PATENT DOCUMENTS

| | | | | |
|---|---|---|---|---|
| 5,728,223 A | * | 3/1998 | Murakami et al. | 118/715 |
| 6,086,677 A | * | 7/2000 | Umotoy et al. | 118/715 |
| 6,106,625 A | * | 8/2000 | Koai et al. | 118/715 |
| 7,270,713 B2 | * | 9/2007 | Blonigan et al. | 118/715 |
| 2003/0209323 A1 | * | 11/2003 | Yokogaki | 156/345.34 |
| 2004/0129217 A1 | * | 7/2004 | Strang | 118/715 |
| 2005/0103267 A1 | * | 5/2005 | Hur et al. | 118/715 |
| 2005/0109460 A1 | * | 5/2005 | DeDontney et al. | 156/345.33 |
| 2007/0119546 A1 | * | 5/2007 | Collins et al. | 156/345.48 |

FOREIGN PATENT DOCUMENTS

CN 1617309 A 5/2005
WO 2004112092 A2 12/2004

* cited by examiner

*Primary Examiner*—Ram N Kackar
*Assistant Examiner*—Satish Chandra
(74) *Attorney, Agent, or Firm*—Portland IP Law LLC

(57) ABSTRACT

A gas injector includes: a plate including at least one first injection hole; and at least one nozzle module combined with the plate, the at least one nozzle module including at least one second injection hole connected to the at least one first injection hole.

7 Claims, 7 Drawing Sheets

GAS INJECTOR AND APPARATUS INCLUDING THE SAME

This application claims the priority of Korean Patent Application No. 2005-0027474 filed in Korea on Apr. 1, 2005, in the Korean Intellectual Property Office, the disclosure of which is incorporated herein in its entirety by reference.

BACKGROUND OF THE INVENTION

1. Field of the Invention

The present invention relates to an apparatus for a display device, and more particularly, to an apparatus including a gas injector where a nozzle module is detachable.

2. Discussion of the Related Art

Flat panel display (FPD) devices having portability and low power consumption have been a subject of increasing research in the present information age. Among the various types of FPD devices, liquid crystal display (LCD) devices are commonly used in notebook and desktop computers because of their high resolution, capability of displaying colored images, and high quality image display.

In general, an LCD device includes a first substrate, a second substrate and a liquid crystal layer between the first and second substrates. The first substrate and the second substrate may be referred to as an array substrate and a color filter substrate, respectively. A gate line, a data line, a thin film transistor (TFT) and a pixel electrode are formed on the first substrate, and a color filter layer and a common electrode are formed on the second substrate. The gate line crosses the data line to define a pixel region, and the TFT is connected to the gate line and the data line. In addition, the pixel electrode connected to the TFT is formed in the pixel region.

A semiconductor device or an LCD device is fabricated by repetition of a deposition step of forming a thin film on a wafer or a glass substrate, a photolithographic step of exposing some portions of the thin film using a photosensitive material, a patterning step of removing the exposed thin film and a cleaning step of eliminating a residual material. Each step of the fabrication process is performed in a chamber of an apparatus under an optimum condition for each step.

FIG. 1 is a schematic cross-sectional view showing a plasma apparatus for a semiconductor device or a display device according to the related art. In FIG. 1, the plasma apparatus includes a chamber 10 defining a reaction space, a susceptor 20 having a substrate 30 thereon, a gas injector 40 over the susceptor 20 and a gas supply tube 80. The gas injector 40, which may be referred to as a shower head or a gas distributor, includes a plurality of injection holes 42 to distribute gases toward the susceptor 20. An upper plate 50 is disposed over the gas injector 40 and functions as a plasma electrode to apply a radio frequency (RF) power to reaction gases. The upper plate 50 is connected to an RF power supply 60, and an impedance matching box (IMB) 70 is connected between the upper plate 50 and the RF power supply 60 to maximize the RF power. The susceptor 20 is grounded to function as an opposite electrode to the plasma electrode. The RF power may be applied to the susceptor 20. An edge portion of the gas injector 40 is fixed to the upper plate 50 to define a buffer space 52. Reaction gases are supplied to the buffer space 52 through the gas supply tube 80 from an exterior gas tank (not shown) and then are primarily diffused in the buffer space 52. Accordingly, the reaction gases are uniformly injected into the chamber 10.

FIG. 2 is a schematic perspective view showing a gas injector of a plasma apparatus for a semiconductor device or a display device according to the related art. In FIG. 2, the gas injector 40 includes a plurality of injection holes 42. The gas injector 40 may be formed of aluminum (Al) and may have a size larger than a substrate. Since only the edge portion of the gas injector 40 is fixed to the chamber 10 (of FIG. 1) or the upper plate 50 (of FIG. 1), a central portion of the gas injector 40 sages under the weight. The sag of the central portion causes non-uniformity in gas distribution between the edge portion and the central portion. As the size of the gas injector 40 increases, the sag in the gas injector 40 increases. To prevent the sag in the gas injector 40, the gas injector 40 may be formed to have an increased thickness "t." For example, the gas injector 40 may have a thickness of about 30 mm to about 35 mm in a plasma apparatus for a 1500 mm×1850 mm substrate, while the gas injector 40 may have a thickness of about 50 mm in a plasma apparatus for a 1950 mm×2250 mm substrate.

In addition, since the plurality of injection holes 42 are formed to have a density of about 11000 ea/m2, the injection holes 42 of about 35000 ea may be formed in the gas injector 40 of a plasma apparatus for a 1500 mm×1850 mm substrate and the injection holes 42 of about 50000 ea may be formed in the gas injector 40 of a plasma apparatus for a 1950 mm×2250 mm substrate. Further, the injection holes 42 over about 60000 ea may be formed in the gas injector 40 of a plasma apparatus for a 2200 mm×2550 mm substrate.

FIGS. 3A and 3B are schematic cross-sectional views showing an injection hole of a gas injector according to the related art. In FIG. 3A, the injection hole 42 includes a gas inlet portion 42a, a nozzle portion 42b, a first diffusing portion 42c and a second diffusing portion 42d having different shapes and different diameters from one another. In FIG. 3B, the injection hole 42 includes a nozzle portion 42b, a first diffusing portion 42c and a second diffusing portion 42d having different shapes and different diameters from one another without a gas inlet portion 42a.

The nozzle portion 42b may have a diameter of about 0.4 mm to about 0.8 mm, and the gas inlet portion 42a and the first diffusing portion 42c may have a diameter over about 3 mm. Through the nozzle portion 42b having a finite diameter, the reaction gases are uniformly diffused in the buffer space 52 (of FIG. 1) and are uniformly injected into the chamber 10 (of FIG. 1) by increasing a pressure of the reaction gases in an upper portion of the injection hole 42. Accordingly, as a diameter of the nozzle portion 42b decreases, the reaction gases are injected more uniformly.

To obtain the injection hole 42 of FIGS. 3A and 3B, after the nozzle portion 42b is formed in the gas injector 40 (of FIG. 1), the gas inlet portion 42a and the first diffusing portion 42c are sequentially formed at upper and lower portions of the nozzle portion 42b. However, it requires high manufacturing technology to form the nozzle portions 42b over 50000 ea each having a diameter of about 0.4 mm in an aluminum (Al) plate having a thickness of about 50 mm. In addition, when a single nozzle portion 42b is inferiorly formed during the manufacture of the injection holes 42, the gas injector 40 (of FIG. 1) having the inferior nozzle portion 42b cannot be used for a plasma apparatus requiring high accuracy and high uniformity. Accordingly, the gas injector 40 (of FIG. 1) having the inferior nozzle portion 42b should be disused. Accordingly, fabrication cost for the gas injector increases and production period for the gas injector is elongated.

SUMMARY OF THE INVENTION

Accordingly, the present invention is directed to an apparatus including a gas injector that substantially obviates one or more of the problems due to limitations and disadvantages of the related art.

An object of the present invention is to provide a gas injector having decreased fabrication cost and shortened production period.

Another object of the present invention is to provide a gas injector having a detachable nozzle module.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gas injector includes: a plate including at least one first injection hole; and at least one nozzle module combined with the plate, the at least one nozzle module including at least one second injection hole connected to the at least one first injection hole.

In another aspect, an apparatus for a display device includes: a chamber; a susceptor in the chamber; and a gas injector over the susceptor, the gas injector comprising: a plate including at least one first injection hole; and at least one nozzle module combined with the plate, the at least one nozzle module including at least one second injection hole connected to the at least one first injection hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Since the present invention relates to a plasma apparatus such as a plasma enhanced chemical vapor deposition (PECVD) apparatus and an etcher where process gases are excited to a plasma state in a chamber and contact a substrate, the plasma apparatus may be a fabrication apparatus for a liquid crystal display (LCD) device or a semiconductor device. In addition, the substrate may be a glass substrate for an LCD device or a wafer for a semiconductor device. Although a plasma apparatus is not shown in figures, a plasma apparatus includes a chamber, a susceptor in the chamber and a gas injector over the susceptor. A substrate is disposed on the susceptor and reaction gases of an exterior gas supply are injected into the chamber. The reaction gases are distributed onto the substrate through the gas injector.

Figure 1:
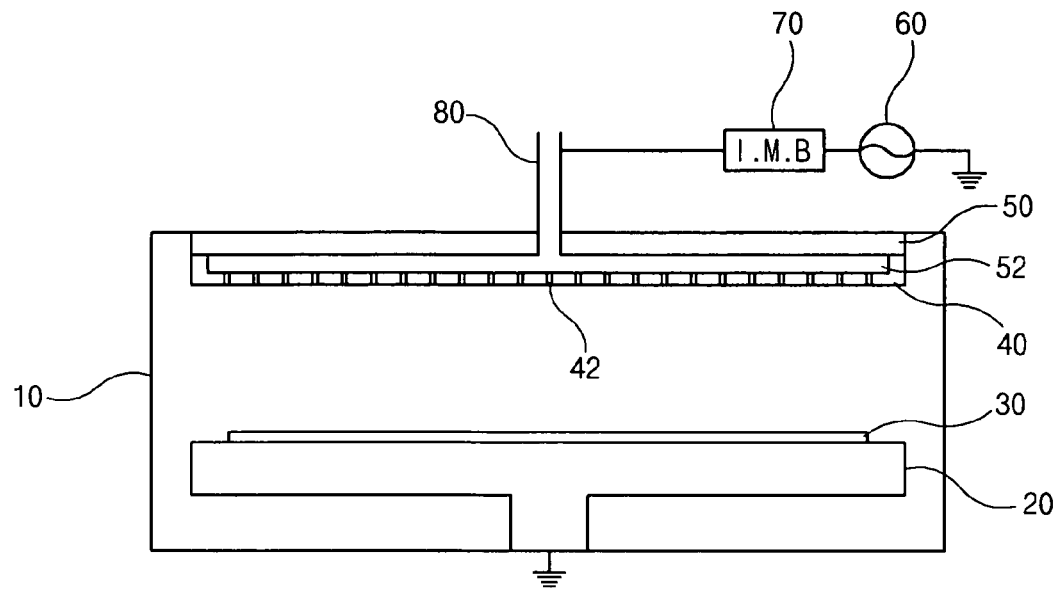
FIG. 1 is a schematic cross-sectional view showing a plasma apparatus for a semiconductor device or a display device according to the related art.
Figure 2:
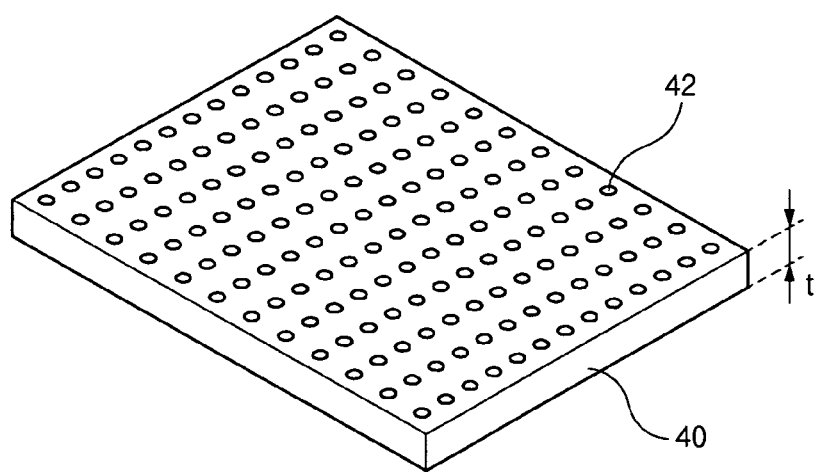
FIG. 2 is a schematic perspective view showing a gas injector of a plasma apparatus for a semiconductor device or a display device according to the related art.
Figure 3A:
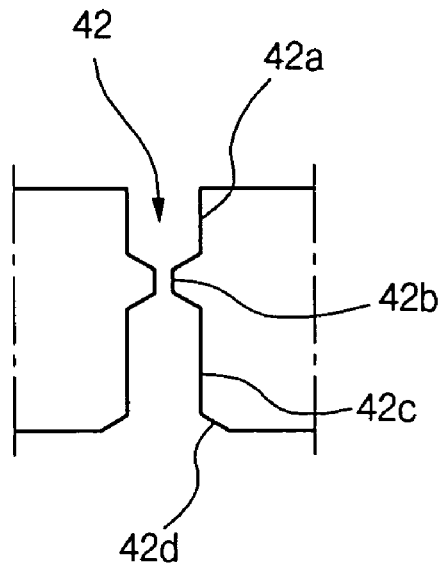
FIGS. 3A and 3B are schematic cross-sectional views showing an injection hole of a gas injector according to the related art.
Figure 3B:
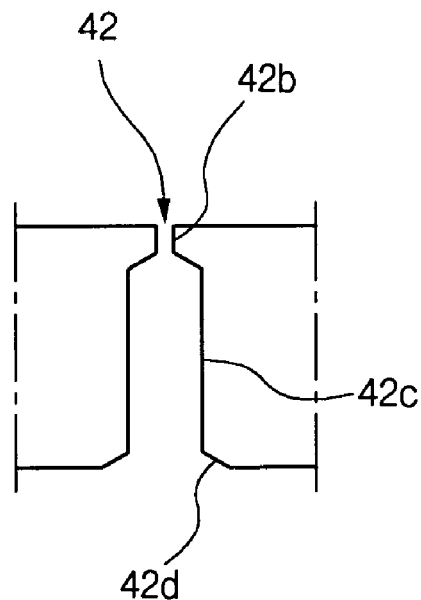
Figure 4:
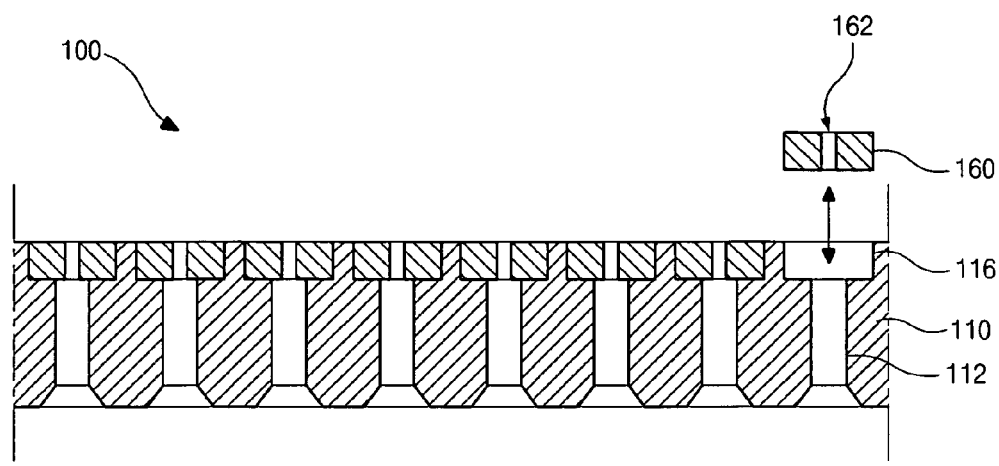
FIG. 4 is a schematic cross-sectional view showing a gas injector of a plasma apparatus according to a first embodiment of the present invention.
Figure 5:
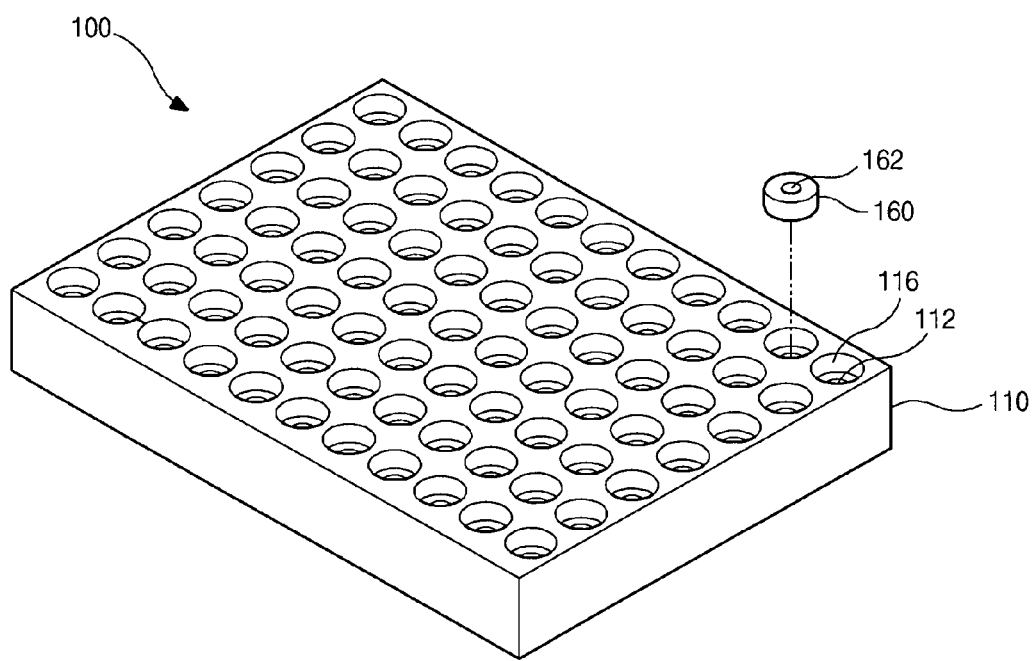
FIG. 5 is a schematic perspective view showing a gas injector of a plasma apparatus according to a first embodiment of the present invention.

FIGS. 4 and 5 are a schematic cross-sectional view and a schematic perspective view, respectively, showing a gas injector of a plasma apparatus according to a first embodiment of the present invention.

In FIGS. 4 and 5, a gas injector 100 includes a plate 110 and a plurality of nozzle modules 160. Even though not shown in FIGS. 4 and 5, the plate functions as a lower plate in a plasma apparatus including an upper plate functioning as a plasma electrode for a radio frequency (RF) power. The plate 110 includes a plurality of first injection holes 112 and a plurality of openings 116 corresponding to the plurality of first injection holes 112. Each opening 116 is formed on the corresponding first injection hole 112, and each nozzle module 160 can be attached to and detached from the plate 110. Accordingly, each nozzle module 160 is detachable with respect to the plate 110. Each opening 116 is formed in the plate 110 as a concave portion to have a diameter greater than a diameter of each first injection hole 112.

Figure 6:
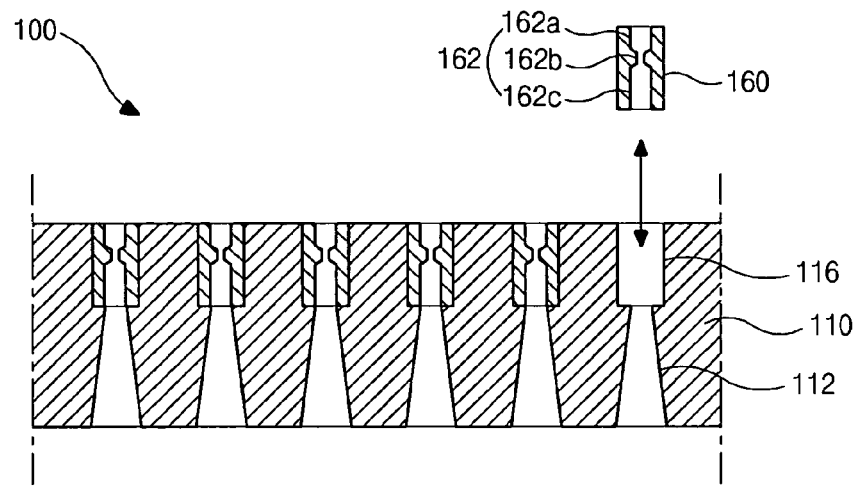
FIG. 6 is a schematic cross-sectional view showing a gas injector of a plasma apparatus according to a second embodiment of the present invention.

For example, each first injection hole 112 may have a diameter of about 2 mm to about 10 mm. As shown in FIG. 4, each first injection hole 112 may have a cylindrical hollow shape with a tapering bottom portion. Alternately, each first injection hole 112 may have a tapering hollow shape such that a diameter gradually increases with a distance from a top portion as shown in FIG. 6.

The nozzle module 160 can be inserted into the opening 116. The nozzle module 160 may have a cylinder shape including a second injection hole 162 at a central portion of the cylinder shape. The second injection hole 162 is connected to the first injection hole 112 when the nozzle module 160 is inserted into the opening 116. As shown in FIG. 4, the second injection hole 162 may have a cylindrical hollow shape. Alternatively, the second injection hole 162 may have a sandglass hollow shape including a gas inlet portion 162a, a nozzle portion 162b and a diffusing portion 162c as shown in FIG. 6. The gas inlet portion 162a, the nozzle portion 162b and the diffusing portion 162c may have different diameters form one another. The minimum diameter of the second injection hole 162 may be within a range of about 0.1 mm to about 1 mm regardless of the shape of the second injection hole 162. In addition, the nozzle module 160 may have various shapes in accordance with the shape of the opening 116. For example, when the opening 116 has a polygon shape, the nozzle module 160 may have a polygon shape.

The nozzle module 160 and the opening 116 closely adhere to each other to prevent leakage of reaction gases when attached. For closer adhesion, screw holes may be further formed on an outer surface of the nozzle module 160 and an inner surface of the opening 116 so that the nozzle module 160 and the opening 116 can be combined using a screw. In addition, a fixing means may be formed on an inner surface of the opening 116 so that the nozzle module 160 can be fixed to the opening through the fixing means.

Since the nozzle module 160 having the finite second injection hole 162 is detachable, only the first injection hole 112 and the opening 116 having a diameter greater than a diameter of the second injection hole 162 are formed in the plate 110 of aluminum (Al). Accordingly, fabrication inferiority and production period are improved. Even though the nozzle module 160 is formed of aluminum (Al), the nozzle module 160 may be fabricated using a mass production system because formation of a finite injection hole in a nozzle module thinner than a plate has lower inferiority. In fabrication of a gas injector according to the related art, when the plate of aluminum (Al) is judged to have an inferior nozzle portion, the corresponding plate is disused. In fabrication of a gas injector according to the present invention, even when the nozzle module of aluminum (Al) is judged to have an inferior second injection hole, the corresponding nozzle module is eliminated and the plate can be used. In addition, since the nozzle module 160 and the plate 110 can be simultaneously fabricated, production period for a gas injector is shortened and fabrication cost is reduced. Furthermore, since the nozzle module 160 is individually combined with the plate 110, injection direction or injection speed of reaction gases can be locally controlled by varying a diameter and a direction of the second injection hole 162.

Figure 7:
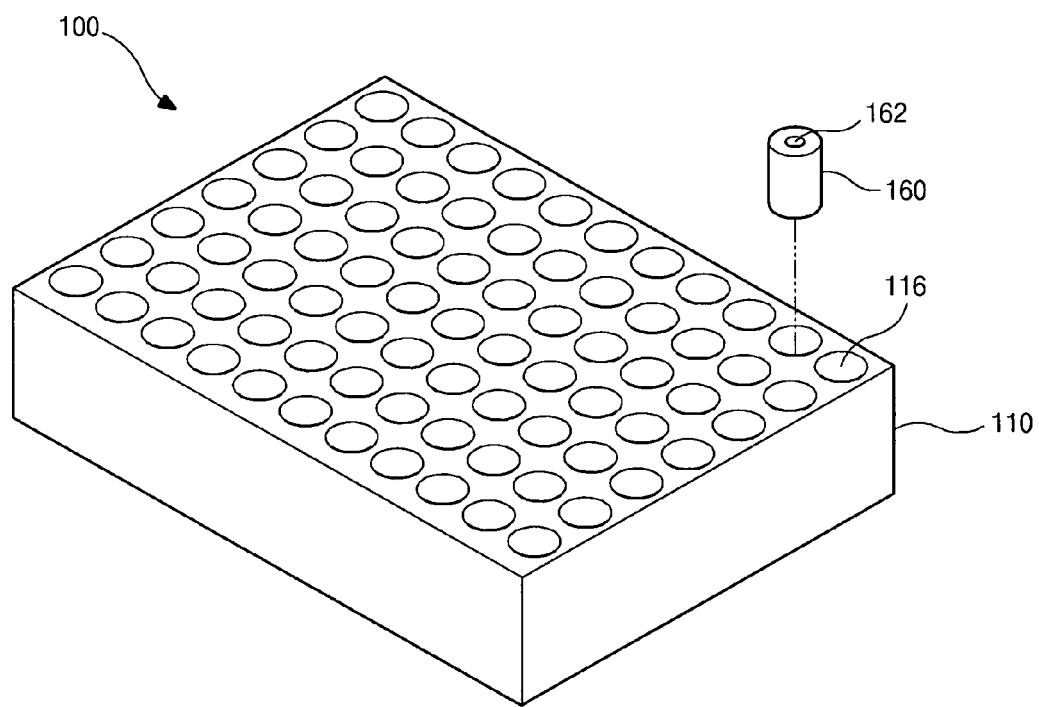
FIG. 7 is a schematic perspective view showing a gas injector of a plasma apparatus according to a second embodiment of the present invention.

FIGS. 6 and 7 are a schematic cross-sectional view and a schematic perspective view, respectively, showing a gas injector of a plasma apparatus according to a second embodiment of the present invention.

In FIGS. 6 and 7, a gas injector 100 includes a plate 110 and a plurality of nozzle modules 160. Each first injection hole 112 of the plate 110 may have a tapering hollow shape such that a diameter gradually increases with a distance from a top portion, and a second injection hole 162 of the nozzle module 160 may have a sandglass hollow shape including a gas inlet portion 162a, a nozzle portion 162b and a diffusing portion 162c. As a result, a thickness of the nozzle module 160 of the second embodiment may increase as compared with the nozzle module 160 of the first embodiment.

Figure 8:
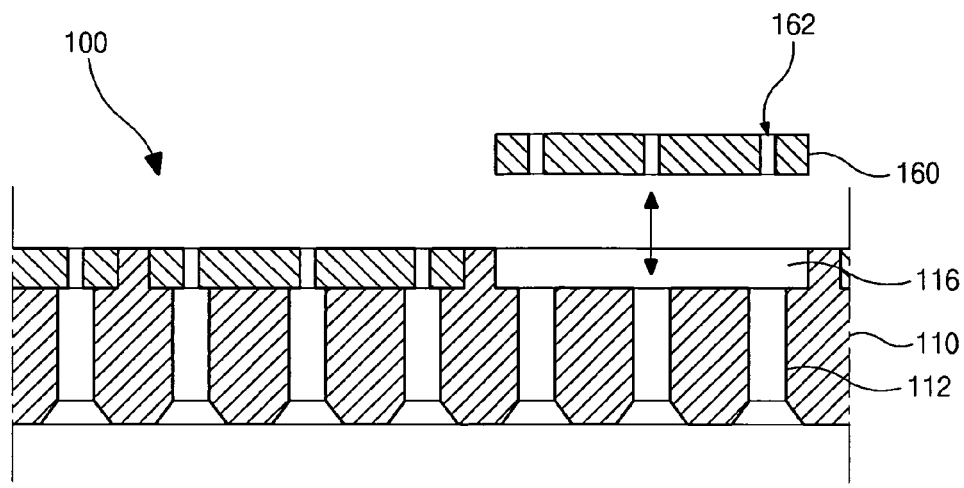
FIG. 8 is a schematic cross-sectional view showing a gas injector of a plasma apparatus according to a third embodiment of the present invention.
Figure 9:
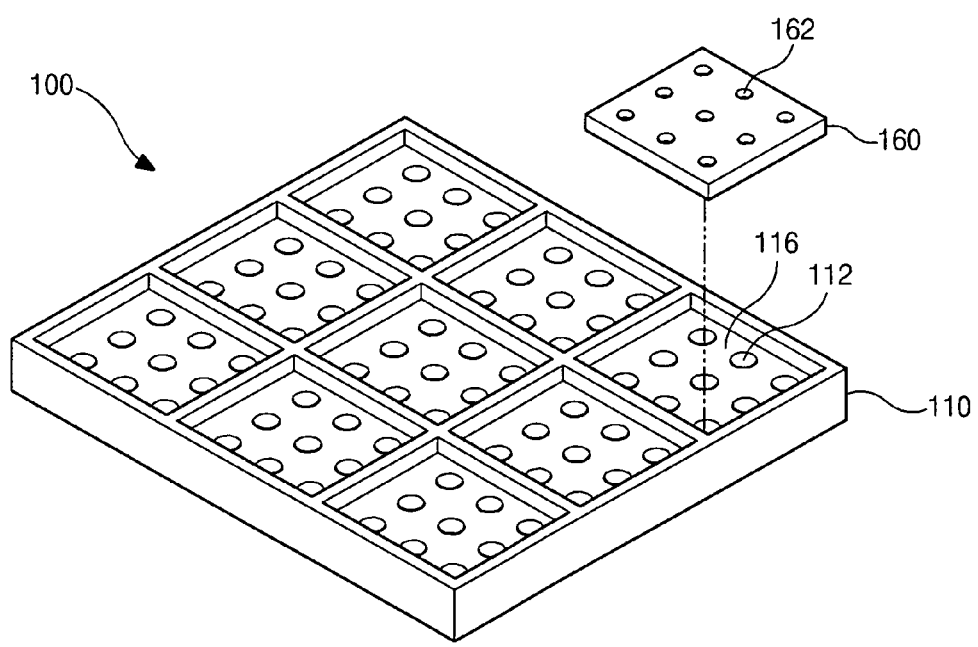
FIG. 9 is a schematic perspective view showing a gas injector of a plasma apparatus according to a third embodiment of the present invention.

FIGS. 8 and 9 are a schematic cross-sectional view and a schematic perspective view, respectively, showing a gas injector of a plasma apparatus according to a third embodiment of the present invention.

In FIGS. 8 and 9, a gas injector 100 includes a plate 110 and a plurality of nozzle modules 160. The plate 110 includes a plurality of first injection holes 112 and a plurality of openings 116. The nozzle module 160 includes a plurality of second injection holes 162 and can be inserted into the opening 116. Here, a single opening 116 corresponds to a plurality of first injection holes 112 instead of a single first injection hole. For example, when the nozzle module 160 is inserted into the opening 116 corresponding to nine first injection holes 112, the nozzle module 160 may include nine second injection holes 162 each corresponding to the single first injection hole 112. As a result, a single opening 116 may correspond to nine first injection holes 112 and nine second injection holes 162. In another embodiment, the single opening may correspond to a different number of first injection holes and a different number of second injection holes.

The nozzle module 160 may have a tetragonal pillar shape such as a rectangular pillar or a square pillar. In addition, an O-ring is further formed between the opening 116 and the nozzle module 160 to prevent leakage of reaction gases. When an O-ring is formed, the nozzle module 160 may be formed to be separated from an inner bottom surface of the opening 116 using the O-ring in a groove of the inner bottom surface of the opening 116.

Figure 10:
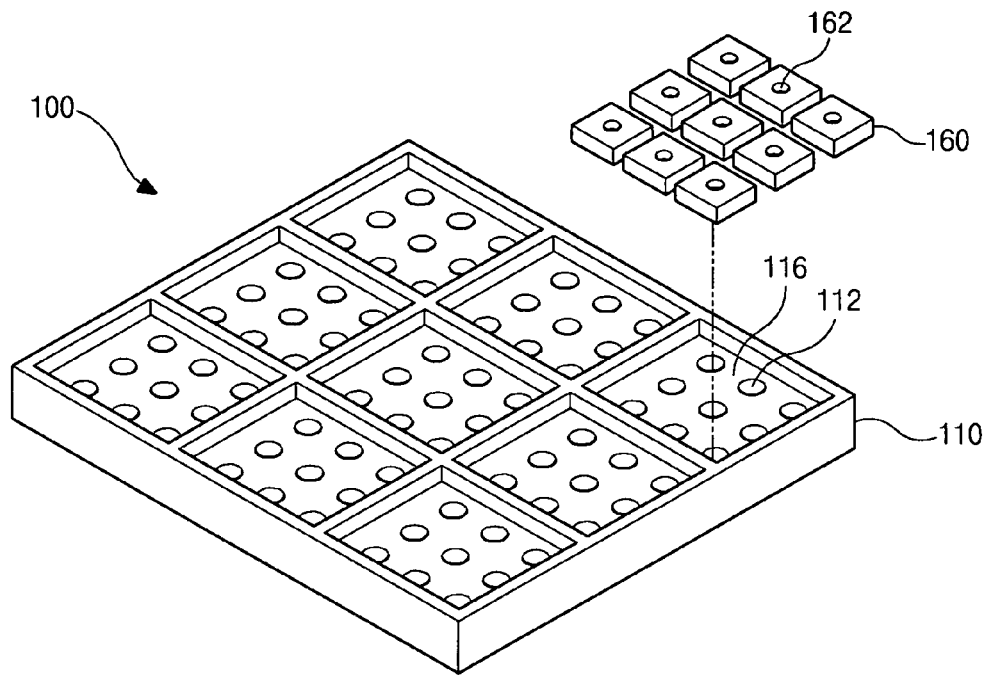
FIG. 10 is a schematic perspective view showing a gas injector of a plasma apparatus according to a fourth embodiment of the present invention.

FIG. 10 is a schematic perspective view showing a gas injector of a plasma apparatus according to a fourth embodiment of the present invention.

In FIG. 10, a single opening 116 of a plate 110 corresponds to a plurality of first injection holes 112 in the plate 110 and a plurality of second injection holes 162. However, a single nozzle module 160 includes the single second injection hole 162 instead of the plurality of second injection holes as in FIGS. 8 and 9. Accordingly, the nozzle modules 160 having the same number as the first injection holes 112 are inserted into the single opening 116. Here, the first injection hole 112 and the second injection hole 162 are connected to each other with accurate alignment so that reaction gases can be injected though the second injection hole 162 and the first injection hole 112.

Figure 11:
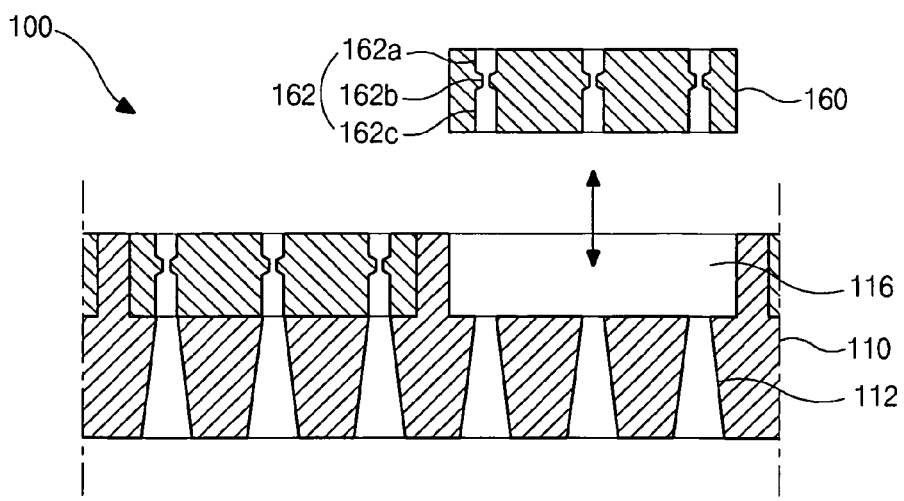
FIG. 11 is a schematic cross-sectional view showing a gas injector of a plasma apparatus according to a fifth embodiment of the present invention.

FIG. 11 is a schematic cross-sectional view showing a gas injector of a plasma apparatus according to a fifth embodiment of the present invention.

In FIG. 11, a single opening 116 of a plate 110 corresponds to a plurality of first injection holes 112 in the plate 110 and a plurality of second injection holes 162, and a single nozzle module 160 includes the plurality of second injection holes 162. The first injection hole 112 has a tapering hollow shape such that a diameter gradually increases with a distance from a top portion. The second injection hole 162 has a sandglass hollow shape including a gas inlet portion 162a, a nozzle portion 162b and a diffusing portion 162c.

Figure 12:
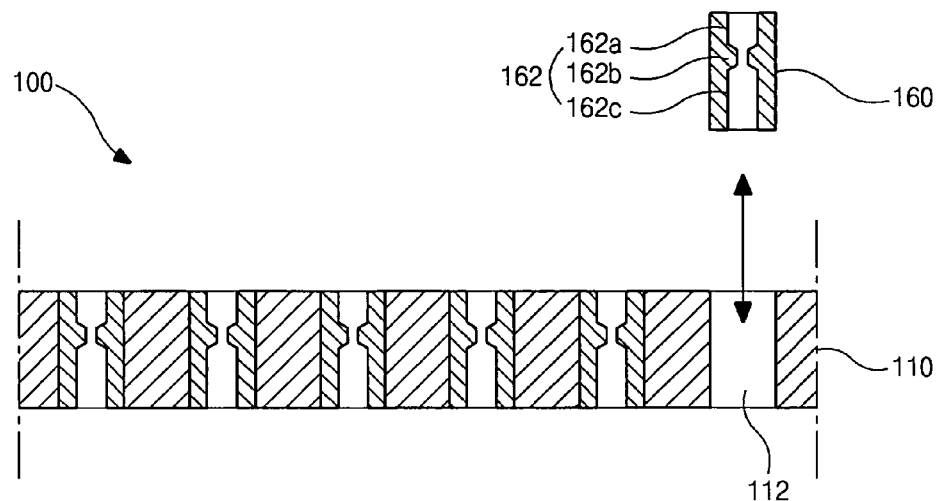
FIG. 12 is a schematic cross-sectional view showing a gas injector of a plasma apparatus according to a sixth embodiment of the present invention.
Figure 13:
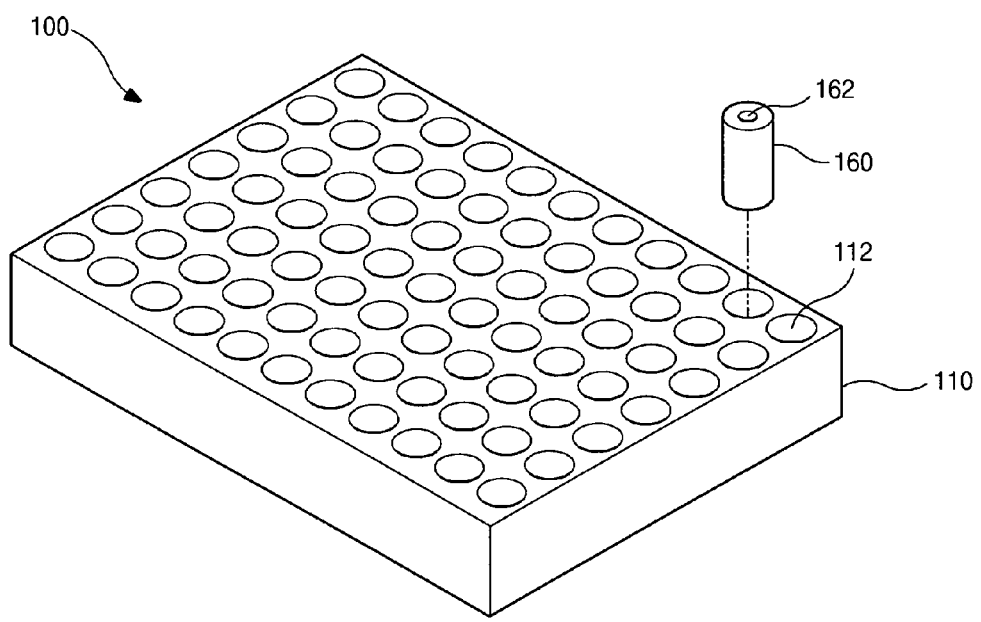
FIG. 13 is a schematic perspective view showing a gas injector of a plasma apparatus according to a sixth embodiment of the present invention.

FIGS. 12 and 13 are a schematic cross-sectional view and a schematic perspective view, respectively, showing a gas injector of a plasma apparatus according to a sixth embodiment of the present invention.

In FIGS. 12 and 13, a gas injector 100 includes a plate 110 and a plurality of nozzle modules 160. The plate 110 includes a plurality of first injection holes 112 without openings, and each first injection hole 112 is formed to have a sufficient diameter to include the nozzle module 160. Accordingly, the nozzle module 160 is directly inserted into the first injection hole 112. The nozzle module 160 and the first injection hole 112 may be combined with each other using a screw to prevent leakage of reaction gases. Moreover, an O-ring may be formed between the first injection hole 112 and the nozzle module 160. The nozzle module 160 includes a second injection hole 162 having a sandglass hollow shape including a gas inlet portion 162a, a nozzle portion 162b and a diffusing portion 162c. Alternately, the single nozzle module 160 may include a plurality of second injection holes 162 when the first injection hole 112 is formed to include the single nozzle module 160. In addition, the second injection hole 162 may have a cylindrical hollow shape. Even though the plate 110 has the same thickness as the nozzle module 160 in FIGS. 12 and 13, the plate 110 and the nozzle module 160 may have different thicknesses from each other in another embodiment.

Consequently, a gas injector according to the present invention includes a detachable nozzle module. As a result, fabrication cost for a gas injector is reduced and production period is shortened. In addition, concentration, direction and speed of reaction gases are locally controlled and by varying a diameter and a direction of an injection hole in the detachable nozzle module.

It will be apparent to those skilled in the art that various modifications and variations can be made in the plasma apparatus having a gas injector without departing from the spirit or scope of the invention. Thus, it is intended that the present invention covers the modifications and variations of this invention provided they come within the scope of the appended claims and their equivalents.

What is claimed is:

1. A two-piece gas injector, comprising:
    a plate including an upper surface and a lower surface having a plurality of first injection holes to inject a gas from the lower surface directly to a reaction space; and
    a plurality of cylindrical nozzle modules combined with the upper surface of the plate, each of the plurality of nozzle modules including at least one second injection hole connected to corresponding one of the plurality of first injection holes to form a gas path therethrough so as to provide the gas from the plurality of second injection holes,
    wherein the upper surface of the plate includes a plurality of openings connected to corresponding ones of the plurality of first injection holes,
    wherein the plurality of nozzle modules are inserted into the plurality of openings, respectively, and
    wherein a diameter of each of the plurality of openings is greater than a diameter of corresponding one of the plurality of first injection holes,
    wherein the gas flows from the upper surface of the nozzle module comprising said second opening to the lower surface of the plate comprising said first opening,
    wherein the plurality of openings and the plurality of nozzle modules are combined with each other using a screw, respectively,
    wherein each of the plurality of first injection hole has one of a cylindrical hollow shape and a tapering hollow shape,
    wherein a diameter of each of the plurality of first injection holes is greater than a diameter of each of the plurality of second injection holes.

2. The gas injector according to claim 1, wherein each of the plurality of nozzle module is attachable to and detachable from corresponding one of the plurality of openings.

3. The gas injector according to claim 1, wherein each of the plurality of second injection holes has a minimum diameter within a range of about 0.1 mm to about 1 mm.

4. The gas injector according to claim 1, wherein the at least one second injection hole directly overlies the corresponding one of the plurality of first injection holes to form the gas path.

5. An apparatus for a display device, comprising:
    a chamber having a reaction space;
    a susceptor in the chamber; and
    a two-piece gas injector over the susceptor, the gas injector comprising:
        a plate including an upper surface and a lower surface having a plurality of first injection holes to inject a gas from the lower surface directly to a reaction space; and
        a plurality of cylindrical nozzle modules combined with the upper surface of the plate, each of the plurality of nozzle modules including at least one second injection hole connected to corresponding one of the plurality of first injection holes to form a gas path therethrough so as to provide the gas from the at least one second injection hole,
    wherein the upper surface of the plate includes a plurality of openings connected to corresponding ones of the plurality of first injection holes,
    wherein the plurality of nozzle modules are inserted into the plurality of openings, respectively, and
    wherein a diameter of each of the plurality of openings is greater than a diameter of each of the plurality of first injection holes,
    wherein the gas flows from the upper surface of the nozzle module comprising said second opening to the lower surface of the plate comprising said first opening,
    wherein the plurality of openings and the plurality of nozzle modules are combined with each other using a screw, respectively,
    wherein each of the plurality of first injection hole has one of a cylindrical hollow shape and a tapering hollow shape,
    wherein a diameter of each of the plurality of first injection holes is greater than a diameter of each of the plurality of second injection holes.

6. The apparatus according to claim 5, wherein each of the plurality of nozzle module is attachable to and detachable from the plate.

7. The apparatus according to claim 5, wherein a concentration of reaction gases in the chamber is locally controlled by varying a diameter and a direction of the plurality of second injection holes.

* * * * *